United States Patent [19]

Lee

[11] Patent Number: 5,156,999

[45] Date of Patent: Oct. 20, 1992

[54] PACKAGING METHOD FOR SEMICONDUCTOR LASER/DETECTOR DEVICES

[75] Inventor: Wai-Hon Lee, 10332 Noel Ave., Cupertino, Calif. 95014

[73] Assignee: Wai-Hon Lee, Cupertino, Calif.

[21] Appl. No.: 536,136

[22] Filed: Jun. 8, 1990

[51] Int. Cl.[5] .................... H01L 21/80; H01L 21/52; H01L 21/58; H01L 21/60

[52] U.S. Cl. .................................. 437/215; 437/902; 357/76; 357/80; 357/81

[58] Field of Search ............... 437/180, 206, 207, 209, 437/215, 902; 357/81

[56] References Cited

U.S. PATENT DOCUMENTS

| | | | |
|---|---|---|---|
| 3,840,889 | 10/1974 | O'Brien et al. | 372/36 |
| 3,878,556 | 4/1975 | Nyul | 357/81 |
| 4,360,965 | 11/1982 | Fujiwara | 29/582 |
| 4,403,243 | 9/1983 | Hakamada | 357/74 |
| 4,567,598 | 1/1986 | Noguchi et al. | 372/36 |
| 4,604,753 | 8/1986 | Sawai | 372/36 |
| 4,739,546 | 4/1988 | Tachibana et al. | 372/44 |
| 4,757,197 | 7/1988 | Lee | 250/239 |
| 4,803,689 | 2/1989 | Shibanuma | 372/36 |
| 4,834,491 | 5/1989 | Aoki et al. | 372/43 |
| 4,847,848 | 7/1989 | Inoue et al. | 372/50 |
| 4,877,756 | 10/1989 | Yamamoto et al. | 437/209 |
| 4,891,333 | 1/1990 | Baba et al. | 437/209 |
| 4,894,707 | 1/1990 | Yamawaka et al. | 437/209 |
| 4,910,741 | 3/1990 | Pillsbury et al. | 372/32 |
| 4,953,171 | 8/1990 | Nakajima et al. | 372/44 |

Primary Examiner—Olik Chaudhuri
Assistant Examiner—David E. Graybill
Attorney, Agent, or Firm—Townsend and Townsend

[57] ABSTRACT

A method for packaging a hybrid device which has a semiconductor laser diode and photodetectors. The laser diode is mounted on a silicon chip (a "silicon submount") containing a photodetector for monitoring the laser power. An array of silicon submounts are mounted on a heat-sink plate which consists of a heat-sink substrate covered with a metal layer. The metal layer is cut in multiple places down to the heat-sink substrate to form multiple conductive strips. The heat-sink plate with the silicon submounts is then covered with a heat-sink cover plate which has identations formed to provide cavities for the silicon submounts. In addition, cavities are provided to allow connections to the conducting metal strips. The combined assembly is then sliced into bars exposing an opening for the laser diode and openings for connections to the conductive strips. The bars are turned on their sides and laminated to a glass substrate to form a front window for the laser diode assembly. The bar is then cut into separate pieces, each having a single laser diode. A photodetector may be mounted on the front of the glass window before or after the bar is cut into pieces.

15 Claims, 7 Drawing Sheets

PACKAGING METHOD FOR SEMICONDUCTOR LASER/DETECTOR DEVICES

A related application is Ser. No. 07/313,691, filed Feb. 21, 1989 and describing an alternate manufacturing method.

BACKGROUND OF THE INVENTION

The present invention relates to a method for packaging hybrid devices containing semiconductor lasers and detectors for detecting laser beams reflected from an external target or external source.

A semiconductor laser is a device which emits light of substantially a single wavelength. The light from this type of laser can be focused to a spot with a diameter comparable to its wavelength. The semiconductor laser belongs to the same family of semiconductor devices as the light-emitting diode (LED). However, the light from an LED has a broader spectrum of wavelengths and thus cannot be focused as sharply as a semiconductor laser. The structure and composition of the laser determine its wavelength, its expected lifetime and its light-guiding mechanism.

Semiconductor laser diodes are generally mounted on a substrate or structure which provides the electrical, thermal, and spatial requirements of the laser diode for the intended application. The combination of a substrate or structure with a laser diode is commonly referred to as a laser assembly. Examples of laser structures are shown in U.S. Pat. Nos. 3,479,613; 3,457,468; 3,293,513; 3,257,626; and 4,483,480.

SUMMARY OF THE INVENTION

The present invention provides a method for packaging a hybrid device which has a semiconductor laser diode and photodetectors. The laser diode is mounted on a semiconductor (e.g., silicon) chip (a "silicon submount") containing a photodetector for monitoring the laser power. An array of silicon submounts are mounted on a heat-sink plate which consists of a heat-sink substrate covered with a metal layer. The metal layer is cut in multiple places down to the heat-sink substrate to form multiple conductive strips.

The heat-sink plate with the silicon submounts is then covered with a heat-sink cover plate which has indentations formed to provide cavities for the silicon submounts. In addition, cavities are provided to allow connections to the conducting metal strips.

The combined assembly is then sliced into bars exposing an opening for the laser diode and openings for connections to the conductive strips. The bars are turned on their sides and laminated to a glass substrate to form a front window for the laser diode assembly. The bar is then cut into separate pieces, each having a single laser diode. A photodetector may be mounted on the front of the glass window before or after the bar is cut into pieces. A multiple photodetector containing four or more individual photosensitive areas for detecting the intensity and shape of the laser light emitted by the laser diode and reflected back from an object can also be mounted on the glass substrate to form a laser/detector hybrid assembly.

Thus, the glass substrate becomes the window for the laser diode. Diffraction-grating or holographiclens structures can also be etched on the surface of the glass substrate to perform beam-splitting or beamfocusing actions.

For a fuller understanding of the nature and advantages of the invention, reference should be made to the ensuing detailed description taken in conjunction with the accompanying drawings.

DETAILED DESCRIPTION OF THE PREFERRED EMBODIMENT

Figure 1:
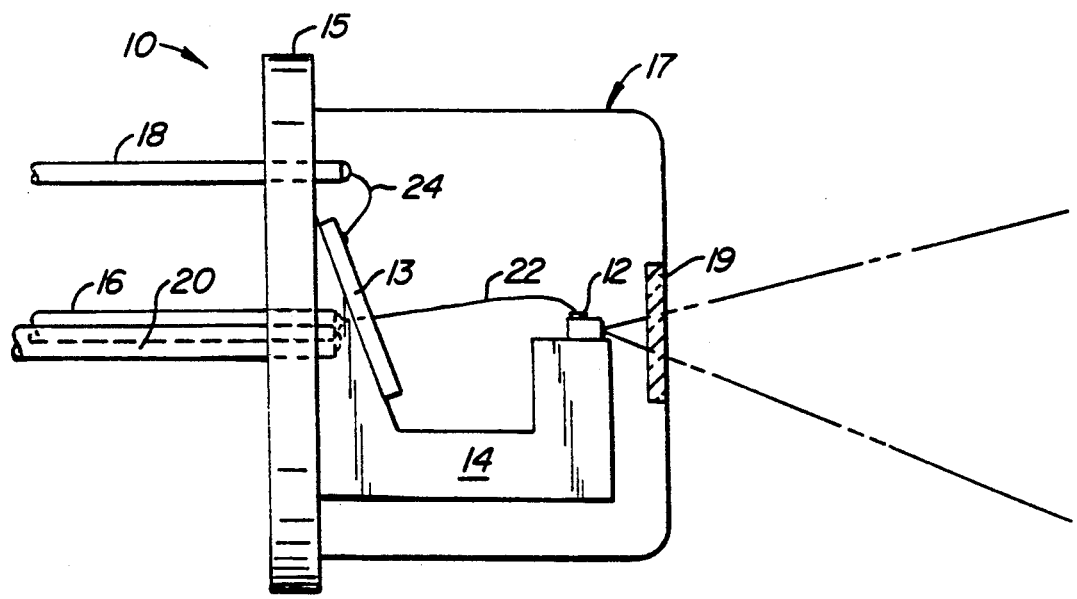
FIG. 1 is a side view of a prior-art laser diode.

FIG. 1 shows a side view of a typical prior-art laser assembly 10. A semiconductor laser diode 12 and a tilted rear photodetector 13 are mounted on a metal heat sink 14 which, in turn, is mounted on a header 15. The assembly is encapsulated by a cap 17 with a glass window 19. Multiple pins 16, 18 and 20 are used to provide electrical connections to the laser diode and photodetector.

Figure 2:
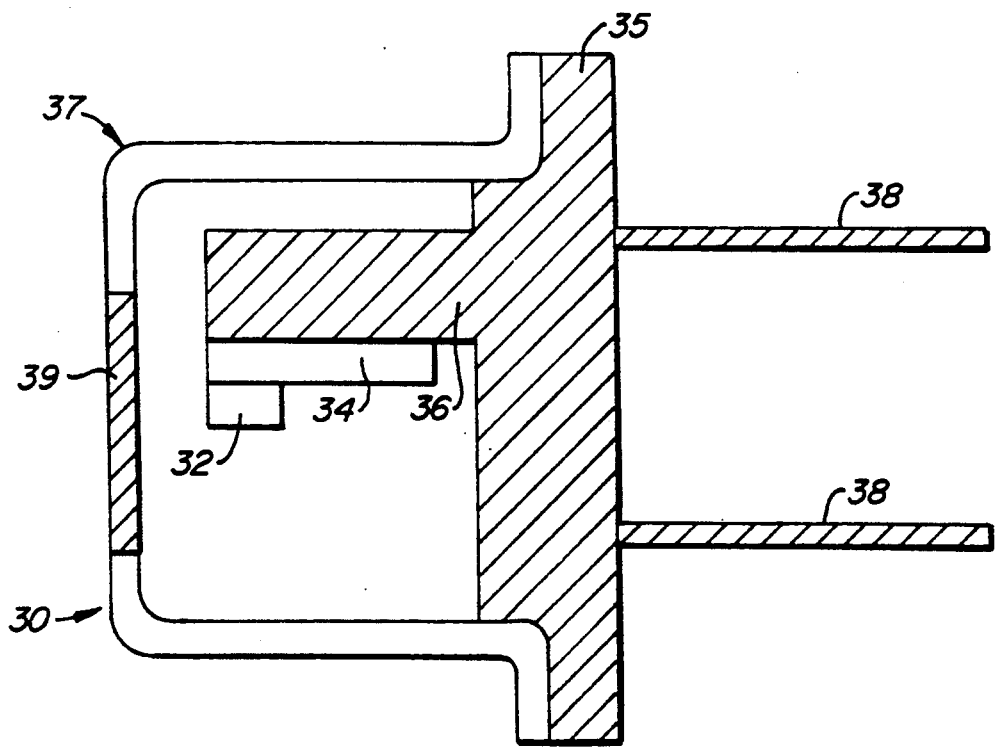
FIG. 2 is a side view of another prior-art laser diode.

FIG. 2 shows the side view of another prior-art laser assembly 30, as disclosed in Japanese Patent Application No. 59-117279(A). A laser diode 32 is attached to a silicon submount 34 which, in turn, is mounted on a copper heat sink 36 with a plurality of output pins 38. The silicon submount is also a photodetector for monitoring the rear facet emission of the laser diode. A cap 37 with a glass window 39 is used to encapsulate the laser diode.

Figure 3:
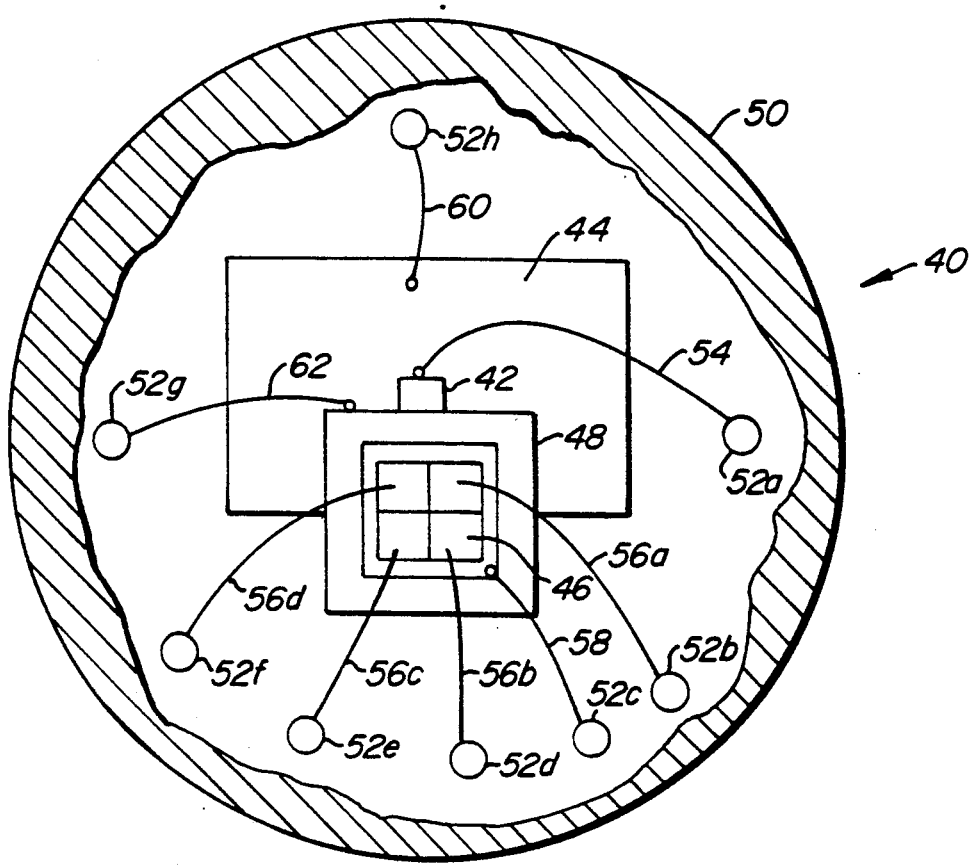
FIG. 3 is a front view of a prior art hybrid device containing a laser diode and multiple photodetectors.

FIG. 3 shows a front view of a prior art laser assembly 40, as disclosed in U.S. Pat. No. 4,757,197. A laser diode 42, a tilted rear photodetector 44 (similar to the tilted rear photodetector 13 of FIG. 1), and a forward four-quadrant photodetector 46 are mounted on a heat sink 48. The heat sink, in turn, is mounted on a header 50 which has a plurality of output pins 52a-52h. The assembly is also encapsulated by a cap with a glass window. Multiple wires 56a-56c, 54, 58, 60 and 62 connect the laser and photodetectors to the output pins 52a-52h.

FIGS. 4-7 show the preferred method for producing the laser-diode assembly of the present invention.

Figure 4B:
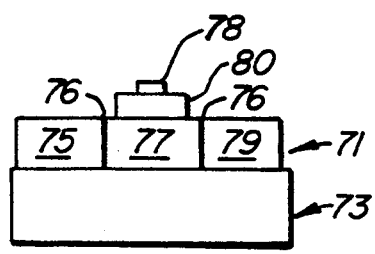
FIG. 4B is a view of the front edge of a device in the device array of FIG. 4A.
Figure 4C:
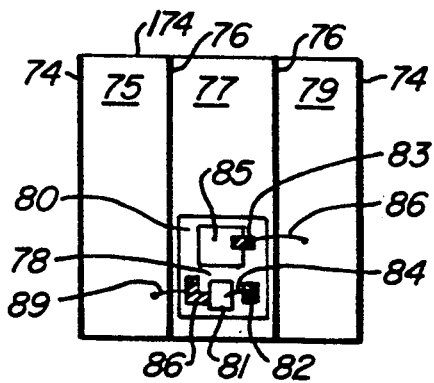
FIG. 4C is a magnified top view of a device in the device array of FIG. 4A.
Figure 4A:
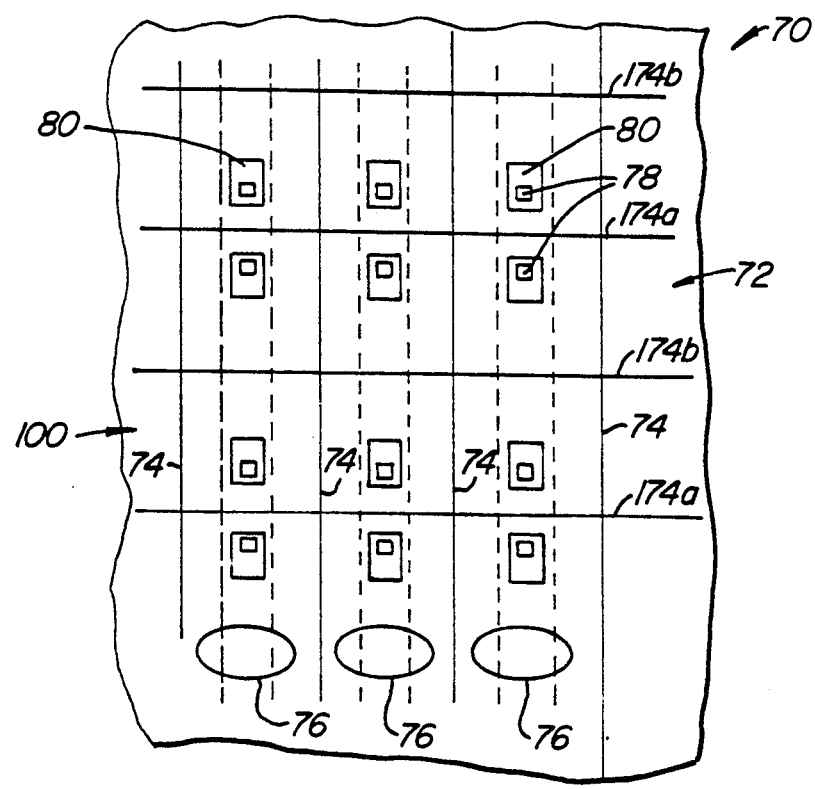
FIG. 4A is a top view of a heat-sink plate according to the present invention with silicon submounts having laser diodes mounted on its surface, forming an array of devices.

FIG. 4A shows an array 70 of laser diodes 78 on silicon submounts 80 which have been mounted on a heat-sink plate 72. Solid lines 74, 174a and 174b in FIG. 4A show the boundaries between the devices in the matrix. Each device is a laser-diode chip 78 mounted on a silicon submount 80 which, in turn, is mounted on the heat-sink substrate 72. Each silicon submount 80 has been cut from an array of silicon submounts, with each having a photodetector 85 as shown in FIG. 4C below. The laser diodes 78 are mounted on the individual silicon submounts with an appropriate bonding material. Shallow cuts are made along the solid lines 74, 174a and 174b and the dotted lines 76 on the surface of the heat-sink plate, preferably before the silicon submounts are attached.

FIG. 4B shows a side view of one device in the matrix of FIG. 4A. In this view, it can be seen that the heat-sink substrate 72 is made of a metal layer 71 laminated to a substrate layer 73 which is an electrically non-conducting but thermally conducting material such as beryllium oxide (BeO). Grooves are cut through the metal layer down to the substrate layer 73 to form electrically isolated metal strips 75, 77, and 79 above the non-conducting substrate. The laser-diode chip 78 is mounted on a silicon submount 80 containing a photodetector which is, in turn, mounted in the center metal strip 77.

FIG. 4C shows a top view of a single device in the matrix of FIG. 4A. The cathode 81 of the laser-diode chip 78 is connected by wire 84 to a bonding pad 82 connected to the cathode of the photodetector 85, which is electrically connected through the silicon submount to the metal strip 77. The anode 83 of the photodetector 85 is connected by wire 86 to the metal strip 79, and a bonding pad 86 connected to the anode of the laser diode 78 is connected by wire 89 to the metal strip 75.

Figure 5:
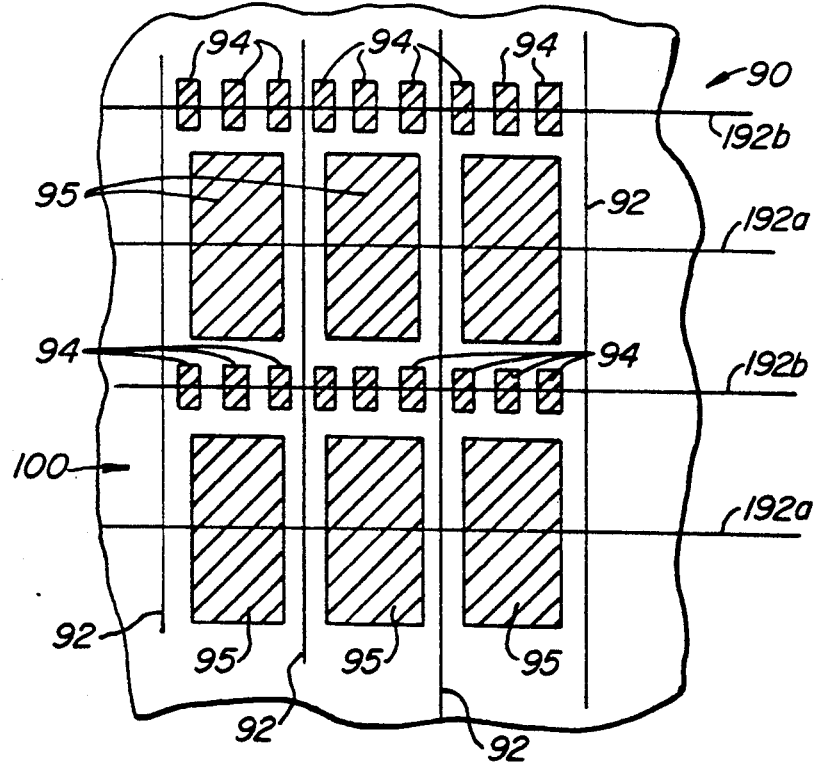
FIG. 5 is a top view of a cover plate for the heat-sink plate of FIG. 4A.

FIG. 5 shows a cover plate 90 made of the same non-conducting material used for the heat-sink plate 73. The solid lines 92, 192a and 192b show the same boundaries 74, 174a and 174b of the devices in FIG. 4A. The shaded areas are indentations made on the cover plate to provide cavities to house the laser diodes and silicon submount. The shaded areas 94 are indentations made on the cover plate to provide cavities for the insertion of pins to connect to the metal strips 75, 77 and 79 of FIG. 4C. The cover plate 90 is laminated to the heat-sink plate 70 by electrically non-conducting but thermally conducting epoxy. The two plates after lamination are cut into bars (such as bar 100) along lines 192a and 192b and lines 174a and 174b, which will be lined up as a result of the lamination.

Figure 6A:
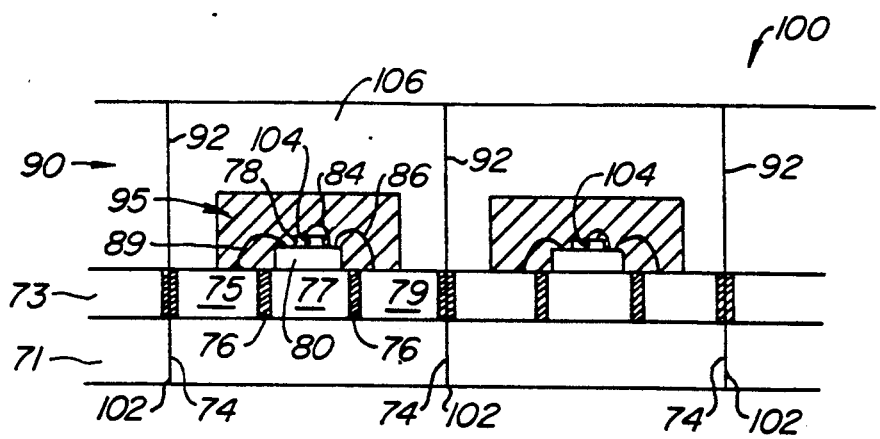
FIG. 6A is a view of the front edge of a segment of a device bar cut from the plate of FIG. 4A covered with the cover plate of FIG. 5.

FIG. 6A shows a view of the front edge of a segment of a bar 100 along a line 192a of FIG. 5 and a line 174a of FIG. 4A. The emission point 104 of the laser-diode chip is located in the geometric center of the device 106. The cavity 95 in FIG. 6A is provided by the indentation 95 shown in FIG. 5. The laser diode 78 and silicon submount are enclosed within cavity 95. The metal strips 75 and 79 are slightly recessed from the boundaries 74 by virtue of the cuts along lines 74 to prevent their being shorted by an external metal structure which may be used to house the laser-diode assembly.

Figure 6B:
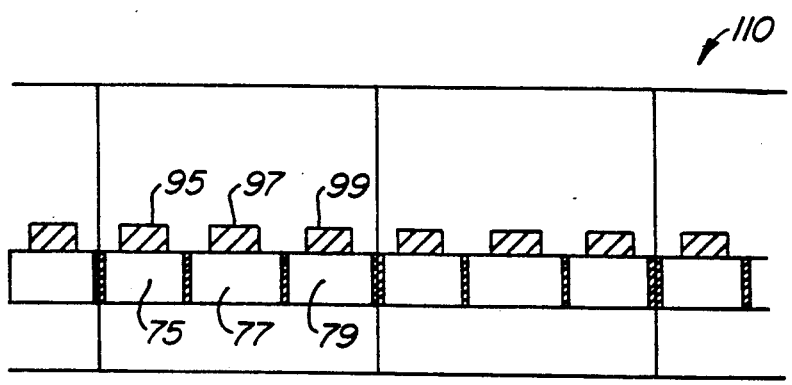
FIG. 6B is a view of the back edge of the segment of FIG. 6A.

FIG. 6B shows a view of the back edge of bar 100 along a line 192b of FIG. 5 and a line 174b of FIG. 4A. The indentations 94 shown in FIG. 5 now become slots 96, 97 and 99 above the metal strips 75, 77, and 79. The slots are for electrical connections to the laser diode and the photodetector. For example, for the embodiment used in this discussion, a pin inserted into slot 96 will provide a connection to both the cathode of the laser diode and the photodetector through metal strip 75 and wire 89 (see FIGS. 4C and 6A). Slot 95 is for the anode of the laser diode, and slot 99 is for the anode of the photodetector.

Figure 6C:
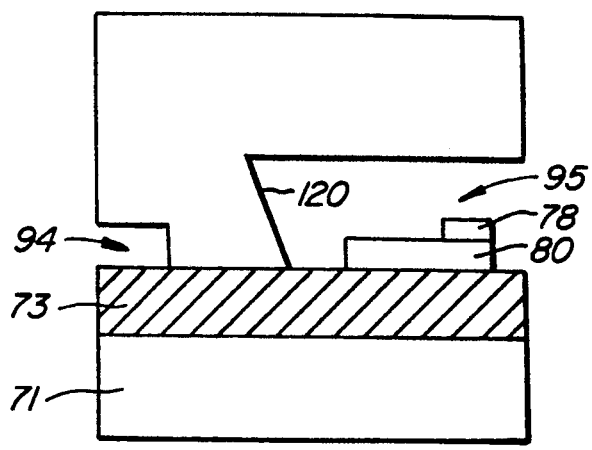
FIG. 6C is a side, cutaway view of a device from the device bar of FIG. 6A.

FIG. 6C shows a side, cutaway view along one of lines 74 and 92 of a device in bar 100. In this view, it can be seen that cavity 95 has a slanted wall 120 to reflect the rear emission of the laser light away from the photodetector. The cavity 95 is located above the metal layer 73 which is above the electrically insulating substrate 71.

Figure 7:
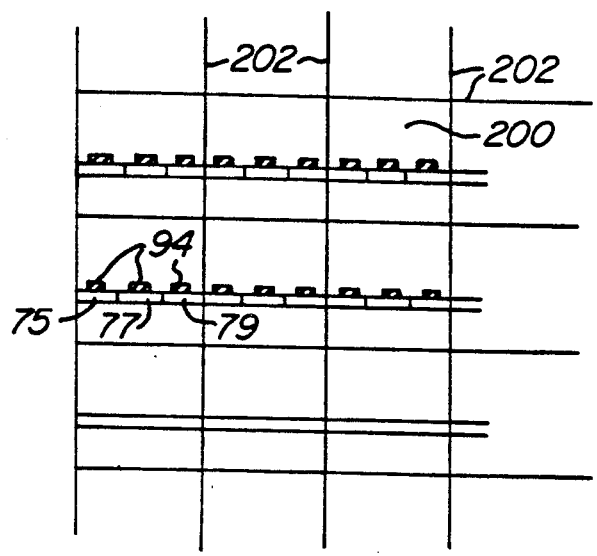
FIG. 7 is a top view of a glass window substrate with multiple device bars of FIG. 6A mounted on its top surface.

The bars thus obtained are cemented with the front edge down onto a glass plate 200, as shown in FIG. 7. The glass plate is of optical quality and is clear without obstruction. The glass plate with the device bar mounted above is then cut into individual devices along the solid boundary lines 202, as shown in FIG. 7.

Figure 8A:
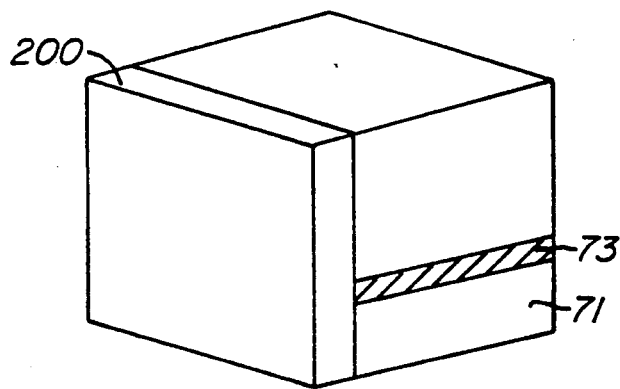
FIG. 8A is a perspective view of one embodiment of a complete laser assembly which is cut from the glass substrate of FIG. 7 with the device bar attached.
Figure 8B:
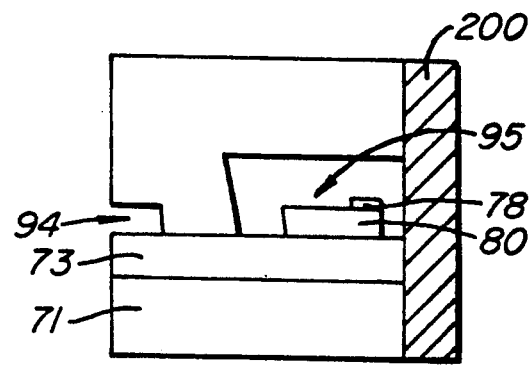
FIG. 8B is a side, cutaway view of the laser-diode assembly of FIG. 8A.

The small rectangular laser-diode assemblies thus obtained are completely sealed devices with glass windows for emission of the laser light, as shown in FIG. 8A. A side, cutaway view of the laser-diode assembly of FIG. 8A is shown in FIG. 8B. The laser diode is slightly recessed from the glass window to avoid contaminating the laser-diode chip with the epoxy used to cement the device bar to the glass plate. The slots on the back of the laser-diode assemblies are used for electrical connection to provide current for the laser diode and to monitor the laser power emitted by the laser diode. Thus, pinouts normally used in prior-art laser-diode assemblies are not needed with the method of the present invention.

Figure 8C:
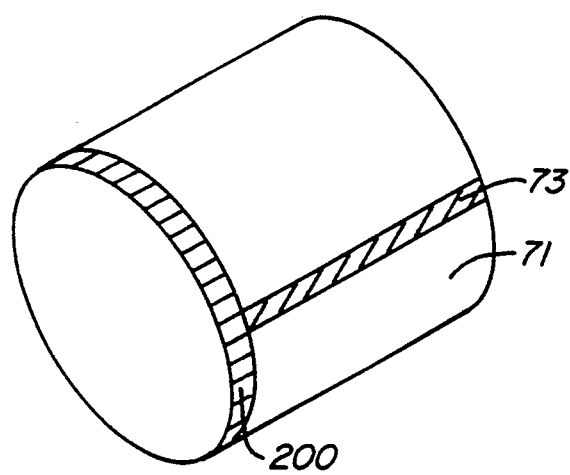
FIG. 8C is a perspective view of another embodiment of a laser-diode assembly cut from the glass substrate of FIG. 7 in a cylinder form by core drilling or cutting.

The laser-diode assembly can be constructed in cylindrical form, as shown in FIG. 8C, using a core drill to cut the device from the device matrix.

In using the laser-diode assembly in a reading device, the laser-diode assembly is housed in another mechanical structure. The method of the present invention allows four large surface areas for dissipation of the heat generated by the laser diode. In contrast, the laser-diode assemblies such as those shown in FIGS. 1 and 2 can dissipate heat generated by the laser diode to external structures only through the rim of the header structures 15 and 35 or to the air through caps 17 and 37.

Figure 9:
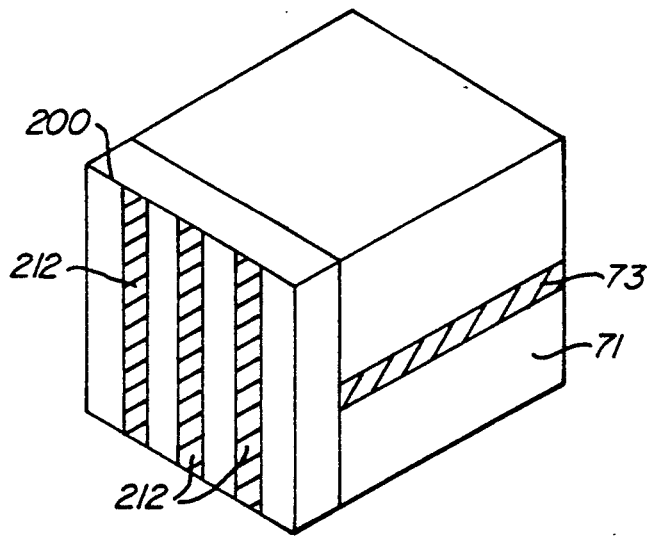
FIG. 9 is a perspective view of another embodiment of the laser assembly of FIG. 8A with a diffraction grating etched on the glass substrate.
Figure 10:
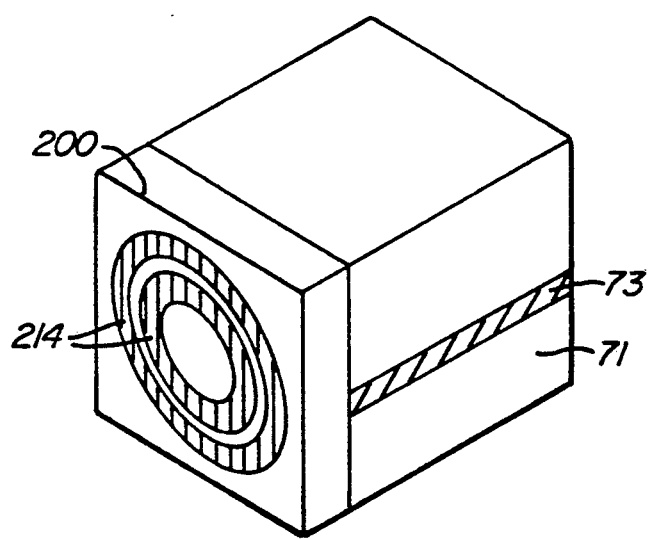
FIG. 10 is a perspective view of another embodiment of the laser assembly of FIG. 9 with a hologram lens etched on the glass substrate.

FIG. 9 shows another embodiment of the laser device of the present invention. The clear glass plate 200 shown in FIG. 7 is replaced by a glass plate with rulings 212 etched or embossed on one of its surfaces to form a diffraction grating. As a result, the devices can provide multiple diffracted beams as required in applications such as compact audio disc players and compact video disc players. Or, if the glass plate 200 is etched with a hologram-lens structure with concentric lines 214, as shown in FIG. 10, the device can focus the light beam to a fine point at a short distance from the device. The fine light beam can then be coupled into the end of an optical fiber.

Figure 11A:
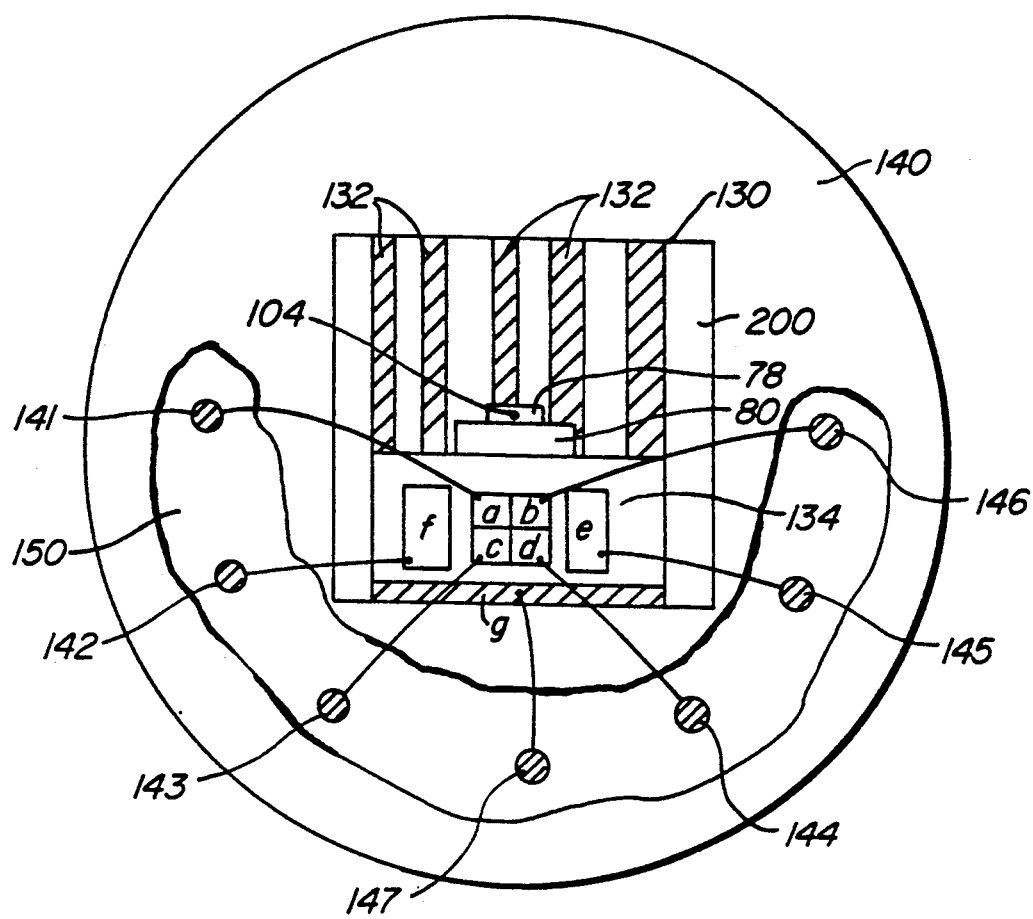
FIG. 11A is a front view of an embodiment of the laser-diode assembly of FIG. 9 with the assembly inserted into a header structure and a photodetector with multiple elements attached to the surface of the glass substrate.
Figure 11B:
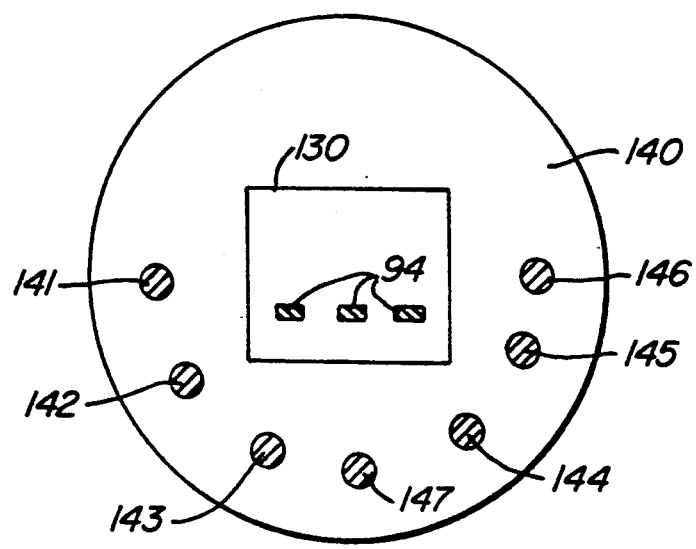
FIG. 11B is a bottom view of the hybrid device of FIG. 11A.

FIG. 11A depicts another embodiment using the laser-diode assembly of the present invention. It shows a laser-diode assembly 130 with a grating lines 132 etched onto the glass window 200, all housed in a header structure 140. A six-segment detector 134 is cemented on the front of glass window 200 a short distance from the center of the glass grating 132. The anodes a, b, c, d, e, and f of the detector are bonded to pins 141, 146, 143, 144, 145, and 142, respectively. The common wires are covered with a layer of epoxy 150 to prevent the wires from breaking. Pins 141, 142, 143, 144, 145, and 146 protrude from the other side of the header structure for electrical connections, as shown in FIG. 11B, which is a rear view of the structure of FIG. 11A. This hybrid device can be used for optical pickup, as described in U.S. Pat. No. 4,458,980, for reading and writing information on an optical medium. In other applications where a single beam is needed, the glass window of the laser-diode assembly 130 is clear and without the grating structure 132.

As will be understood by those familiar with the art, the present invention may be embodied in other specific forms without departing from the spirit or essential characteristics thereof. For example, a number of metal strips other than 3 could be used, and the strips could be orthogonal to the direction of the laser beam. Accordingly, the disclosure of the preferred embodiment of the invention is intended to be illustrative, but not limiting, of the scope of the invention which is set forth in the following claims.

What is claimed is:

1. A method for constructing a semiconductor laser assembly comprising the steps of:
    forming a metal layer over a nonconducting substrate;
    cutting said metal layer down to said substrate along a plurality of parallel lines to form a plurality of metal strips;
    bonding a plurality of semiconductor lasers to said metal strips to form an array;
    laminating a nonconducting cover plate to said metal layer to form a laminated structure, said cover plate having indentations for said semiconductor lasers;
    cutting said laminated structure in front of and behind said semiconductor lasers to form bars having exposed indentations along a front edge;
    bonding said front edge of said bar to a clear glass substrate to form windows for said semiconductor lasers; and
    cutting said bar between said semiconductor lasers to form individual laser assemblies.

2. The method of claim 1 further comprising the steps of:
    forming a plurality of semiconductor submounts having a rear-facet photodetector;
    bonding said semiconductor lasers to said semiconductor submounts in front of said rear-facet photodetectors; and
    bonding said semiconductor submounts to said metal strips to form said array.

3. The method of claim 2 further comprising the steps of:
    bonding a wire between one of said semiconductor lasers and one of said metal strips; and
    bonding a second wire between one of said rear-facet photodetectors and second one of said metal strips.

4. The method of claim 1 further comprising the step of forming a diffraction grating on said clear glass substrate.

5. The method of claim 1 wherein 3 metal strips are formed per individual laser assembly.

6. The method of claim 5 further comprising the step of wire bonding the anode of said rear-facet photodetector to a first one of said metal strips.

7. The method claim 5 further comprising the step of bonding the cathode or anode of the semiconductor laser to the cathode of the rear-facet photodetector.

8. The method of claim 5 further comprising the step of bonding the cathode or anode of the semiconductor laser to one of said metal strips.

9. The method of claim 4 wherein said diffraction grating has uniformly spaced straight fringes.

10. The method of claim 1 further comprising the step of forming a hologram lens with curved fringes on said clear glass substrate.

11. The method of claim 1 further comprising the step of bonding a multiple segment photodetector on the front of said clear glass substrate for sensing the shape of a light beam from said semiconductor laser reflected from an external object.

12. The method of claim 11 further comprising the step of mounting each of said individual laser assemblies into a header structure having multiple pins.

13. The method of claim 1 further comprising the steps of:
    providing second indentations in said cover plate;
    aligning said second indentations over said metal strips;
    cutting said laminated structure to expose said second indentations as holes; and
    inserting pins in said holes to provide electrical contact with said metal strips.

14. A method for constructing a semiconductor laser assembly comprising the steps of:
    forming a metal layer over a nonconducting substrate;
    cutting said metal layer down to said substrate along a plurality of parallel lines to form a plurality of metal strips;
    forming a plurality of semiconductor submounts having a rear-facet photodetector;
    bonding a plurality of semiconductor lasers to said semiconductor submounts in front of said rear-facet photodetectors; and
    bonding said semiconductor submounts to said metal strips to form an array;
    laminating a nonconducting cover plate to said metal layer to form a laminated structure, said cover plate having indentations for said semiconductor lasers;
    cutting said laminated structure in front of and behind said semiconductor lasers to form bars having exposed indentations along a front edge;
    bonding said front edge of said bar to a clear glass substrate to form windows for said semiconductor lasers; and
    cutting said bar between said semiconductor lasers to form individual laser assemblies.

15. A method for constructing a semiconductor laser assembly comprising the steps of:
   forming a metal layer over a nonconducting substrate;
   cutting said metal layer down to said substrate along a plurality of parallel lines to form a plurality of metal strips;
   forming a plurality of semiconductor submounts having a rear-facet photodetector;
   bonding a plurality of semiconductor lasers to said semiconductor submounts in front of said rear-facet photodetectors; and
   bonding said semiconductor submounts to said metal strips to form an array;
   laminating a nonconducting cover plate to said metal layer to form a laminated structure, said cover plate having first indentations for said semiconductor lasers and second indentations aligned over each of said metal strips;
   cutting said laminated structure in front of and behind said semiconductor lasers to form bars having exposed first indentations along a front edge and exposed second indentations along a second edge;
   bonding said front edge of said bar to a clear glass substrate to form windows for said semiconductor lasers;
   cutting said bar between said semiconductor lasers to form individual laser assemblies;
   bonding a wire between one of said semiconductor lasers and a first one of said metal strips;
   bonding a second wire between one of said rear-facet photodetectors and second one of said metal strips;
   forming a diffraction grating on said clear glass substrate;
   bonding a multiple segment photodetector on the front of said clear glass substrate; and
   inserting pins in said exposed second indentations to provide electrical contact with said metal strips.

* * * * *